(12) United States Patent
Dennis et al.

(10) Patent No.: US 7,831,946 B2
(45) Date of Patent: Nov. 9, 2010

(54) CLOCK DISTRIBUTION NETWORK WIRING STRUCTURE

(75) Inventors: Rick L. Dennis, Poughkeepsie, NY (US); Charlie C. Hwang, Hopewell Junction, NY (US); Jose L. Neves, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 557 days.

(21) Appl. No.: 11/830,910

(22) Filed: Jul. 31, 2007

(65) Prior Publication Data

US 2009/0033398 A1 Feb. 5, 2009

(51) Int. Cl.
*G06F 17/50* (2006.01)

(52) U.S. Cl. .................................. 716/6; 716/1; 716/2
(58) Field of Classification Search .................... 716/1, 716/6, 2
See application file for complete search history.

(56) References Cited

U.S. PATENT DOCUMENTS

| | | | |
|---|---|---|---|
| 5,339,253 A * | 8/1994 | Carrig et al. | 716/6 |
| 6,002,857 A | 12/1999 | Ramachandran | |
| 6,205,571 B1 * | 3/2001 | Camporese et al. | 716/2 |
| 6,311,313 B1 * | 10/2001 | Camporese et al. | 716/6 |
| 6,728,936 B1 | 4/2004 | Watkins | |
| 6,778,999 B2 | 8/2004 | Hathaway | |
| 6,874,097 B1 * | 3/2005 | Aliahmad et al. | 713/401 |
| 6,886,143 B1 | 4/2005 | Park | |
| 6,925,622 B2 | 8/2005 | Reyes | |
| 7,051,310 B2 | 5/2006 | Tsao | |
| 2003/0163750 A1 * | 8/2003 | Trivedi et al. | 713/503 |
| 2004/0243957 A1 | 12/2004 | Mandry | |
| 2005/0114820 A1 | 5/2005 | Restle | |
| 2005/0251775 A1 | 11/2005 | Wood | |
| 2006/0053403 A1 | 3/2006 | Cowan | |
| 2006/0107244 A1 | 5/2006 | Yonezawa | |
| 2006/0188050 A1 * | 8/2006 | Jenkins et al. | 375/371 |
| 2006/0190899 A1 | 8/2006 | Migatz | |
| 2006/0245529 A1 * | 11/2006 | Fischer et al. | 375/359 |
| 2008/0024331 A1 * | 1/2008 | Jang | 341/51 |
| 2008/0157385 A1 * | 7/2008 | Yue et al. | 257/773 |

* cited by examiner

*Primary Examiner*—Jack Chiang
*Assistant Examiner*—Suchin Parihar
(74) *Attorney, Agent, or Firm*—William A. Kinnaman, Jr.

(57) ABSTRACT

A wiring structure for clock signals has two or more parallel clock signal wires disposed in adjacent power wire bays that span the distance between the sinks to which the clock signal wires are to be coupled. The parallel clock signal wires are shorted one to another by stubs placed at locations in order to time the clock wiring structure. The delay tuning of the structure is obtained by the discrete movement of wiring stubs between the wiring bays of the pre-defined power grid.

19 Claims, 5 Drawing Sheets

Multi sink net configurations and wiring resources

| Structure | # Sinks | Graph | # Vertical Tracks FO/Length | Remarks |
|---|---|---|---|---|
| FO2 | 2 |  | 2/2 | A layout of this case is illustrated in Figure 2 |
| FO3 | 3 |  | 2/3 | A layout of this case is illustrated in Figure 2 |
| FO4 | 4 |  | 2/3 | Same Trunk as FO2. The green nodes represent two sinks and the length is matched across all sinks |
| FO5 | 5 |  | 3/4 | Same as FO6 with the addition of a dummy node |
| FO6 (a) | 6 |  | 3/4 | Same Trunk as FO3. The green nodes represent two sinks. Snaking is used between the trunk and sinks |
| FO6 (b) | 6 |  | 4/4 | Combination of 1 FO2 and 2 FO32 FO3 drive the 6 sinks and the FO2 drives the sources of the FO3 |

CLOCK DISTRIBUTION NETWORK WIRING STRUCTURE

FIELD OF THE INVENTION

This invention relates to a method and apparatus for providing clock signals to multi sink nets and more particularly to an improved wiring structures that effectively reduces the number of wiring tracks and facilitates the design and tuning for high performance GHz operation with very low intra net skew and bounded signal slew at all sinks to within a specified margin.

BACKGROUND OF THE INVENTION

In the design of very high performance integrated circuits, designers have to deal with the distribution of clock frequencies in the GHz domain. There are several prior art design strategies to distribute GHz clock signals to their destinations. In one strategy, to which the teachings of this invention apply, the clock signal is distributed through a global clock distribution network to reach all the surface area of the chip, using a two-stage distribution network. This global distribution is preferred because most of the synchronous devices in the design work at such frequencies and are placed throughout the surface area of the chip.

DESCRIPTION OF BACKGROUND

Figure 1:
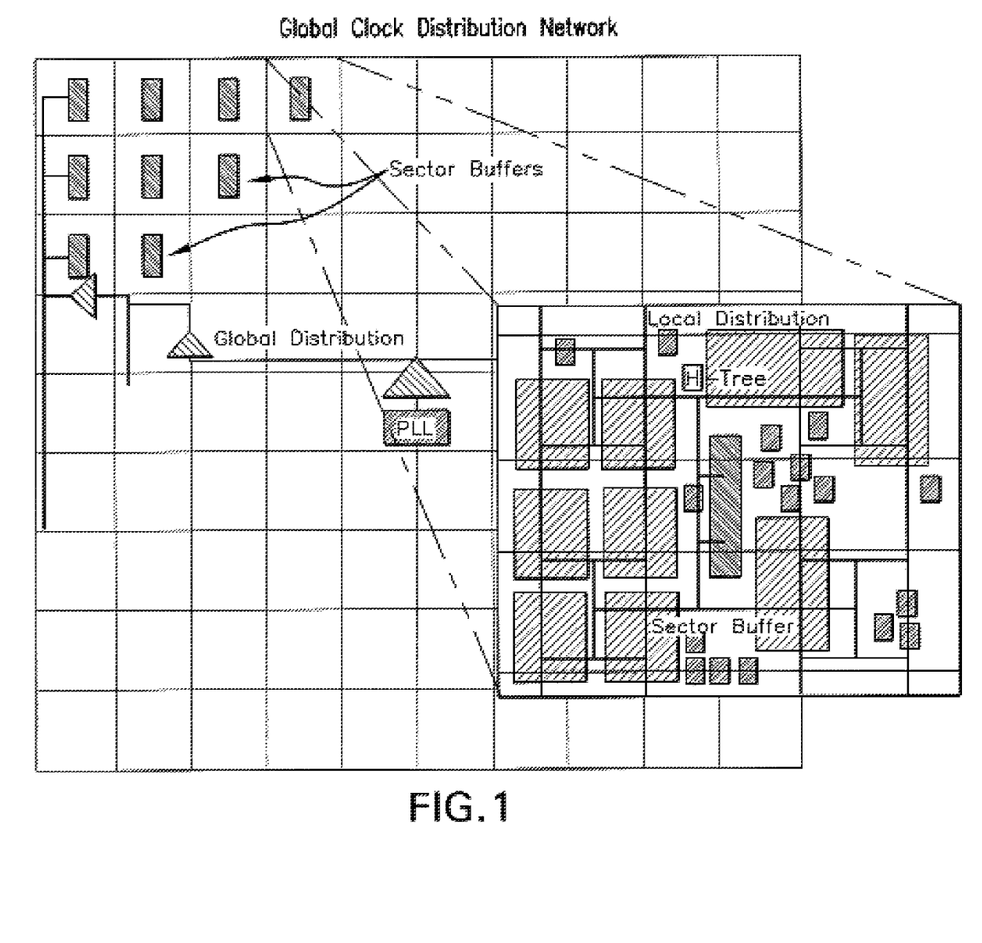
FIG. 1 is a representational view of a global clock distribution network.

In a two-stage clock signal distribution network, the first stage distributes the signal from the source, usually at the center of the chip, to intermediate pre-defined locations called sectors. These sectors form a grid overlapping the chip surface as illustrated in FIG. 1.

Each sector contains one or more buffers, called Sector Buffers, which drive the second stage of the clock distribution network. At this stage, each sector is sensitive to the load in the sector and different wiring structures as well as the optimization techniques are used to reduce clock skew as well as other design parameters. One such wiring structure is an H-Tree connecting to a global mesh or grid as shown in FIG. 1. Clock loads connect to the nearest grid wire are also exemplified in FIG. 1

Up to the sector buffer level (first stage of the network ending at the input of each sector buffer) the design is independent of the clock load pin location. As such, the clock distribution network for this part is designed such that several design parameters are carefully controlled. The main design parameter is clock skew, defined as the delay difference between two clock pins, the delay being the signal latency from the Phase Lock Loop (PLL) to the clock pin. There are two types of clock skew, early mode and late mode clock skew. Early mode clock skew is particularly important because an early mode failure will cause a chip to malfunction. Late mode is also important because a higher skew between two critical clock pins will reduce chip performance.

To simulate a design to meet light constraints on skew, other design parameters need to be carefully controlled. The clock slew at the input of each buffer in the tree must be designed to be less then a pre-defined value. Furthermore, for a given level of the tree, the clock slew cannot be allowed to vary. For a GHz design, the objective is for the clock skew (both early and late) to be in single digits.

To design a GHz clock distribution network of the type described above, careful attention must be paid to the placement of buffers, wire structures used to connect buffers, and the tuning and simulation methodologies. The focus of this invention is on the design of the wiring structures used to connect the buffers in the global distribution network as well as on the tuning methodology designed to meet the specifications of clock skew, clock slew, overshoot and undershoot, and duty cycle for each stage of the global clock distribution network.

The design of a clock distribution network starts with the PLL, which is usually placed at the center of the chip. From there the clock signal must be distributed to every synchronous device requiring a clock signal. Because the clock signal needs to be distributed across the chip, a buffered tree is used to accomplish this task. In high frequency designs, the clock design has priority over other tasks in order to place clock buffers where needed because these buffers are usually much bigger than the functional logic gates and their location is critical to meeting clock design requirements. After placement, the designer wires the tree. In the prior art, to meet clock design requirements buffers are re-sized and wires are tuned (by changing length and/or width) for delay and clock skew. Again, these tasks take precedence over other activities due to the criticality of high performance clock distribution networks.

Wiring structures in clock networks can be a combination of regular and irregular structures. Examples of regular structures are grids and H-Trees, while irregular structures are the ones generated by specialized clock routing tools, such as CPR™. All these structures go through a tuning step where wire length and/or width are adjusted to meet delay and clock skew within a net and/or across a set of nets. In the aforementioned chip design example working at 1.5 GHz the connection between the PLL and the Sector Buffer Grid is through a multi level clock network with different wiring structures between the levels. The focus of this disclosure is on the design and tuning of irregular clock wiring structures used to connect the multi-level network between PLL and Sector Buffers. A common characteristic of these trees is that they span distances of up to several millimeters and are designed to have the same number of sinks for those trees within the same level. Ideally a chip would be equally divided in Sectors of the same size and shape. Furthermore, the sector buffer(s) would be placed at the center of each sector. In reality due to floor plan constraints and clock load distribution, clock sectors have different sizes and aspect ratios and the sector buffers are not placed at the center of such sectors. Furthermore, the number of wiring tracks as well as the maximum width within a track is limited by the power grid and I/O constraints.

Wire sizing can be used as a tuning technique. Using such technique in GHz designs presents several problems. The only way to guarantee accuracy for the types of design constraints is through very accurate SPICE simulations of buffers driving RLC built from realistic extracted data. To prevent coupling noise and false switching noise signals are not allowed to be routed next to clock signals. Therefore a wiring bay between two power-wiring tracks is solely allocated for clocks. The power tracks serve as shields to clocks and provide an accurate and deterministic model for extraction and simulation.

As mentioned before wire sizing can be used as a delay tuning technique. However, changing the width of a wire within a bay requires the change of spacing in the extraction or the addition of more power metal to keep the spacing constant. The first approach complicates the simulation model while the second requires more design time. Therefore, a reliable and easier way of getting wire sizing is by using multiple tracks. But this approach has the potential to indiscriminately use wiring tracks, which are very limited in complex high performance microprocessor designs.

In prior art approaches, specialized clock routing tools connect source to sinks with wiring segments tuned to meet delay targets, by iterative changes in wire width or length and buffer sizing. The result determines the wiring resources needed. For example, if a net contains three sinks evenly spaced in the vertical, a traditional approach would require three or more vertical wiring tracks to match the length between the source and the three sinks. These prior art approaches waste wiring resources due to the need to lengthen or widen the wiring in order to tune the clock distribution system.

SUMMARY OF THE INVENTION

Objects of this invention include:

Minimal use of wiring tracks

Tunable to meet the delay requirements between nets within a level

Tunable to meet the clock skew and slew requirements at each level of the tree

Flexible to be used with nets with different numbers of sinks

Facilitate parasitic extraction and RLC model build for accurate simulations

Easily integrated into a tuning flow for clock skew and clock slew matching. A tuned solution is obtained within the power and I/O wiring constraints Suitable for high performance wiring dominated nets with sinks covering large distances.

Briefly this invention contemplates the provision of a wiring structure (known as FO structure) for clock signals in which two or more parallel clock signal wires are disposed in adjacent power wire bays that span the distance between the sinks to which the clock signal wires are to be coupled. The parallel clock signal wires are shorted one to another by stubs placed at locations in order to tune the clock wiring structure. The delay tuning of the structure is obtained by the discrete movement of wiring stubs between the wiring bays of the pre-defined power grid. This eliminates the need for wire sizing, which simplifies RLC parasitic extraction and improves the accuracy of simulation of the RLC equivalent networks. From initial simulations, the amount of delay change from moving a stub between two power grid bays is determined and similar wiring structures across multiple nets in the same level are tuned.

In a multi-level clock distribution network using FO structures over large chip areas, at each level of the network, it is determined if an FO structure is suitable. Which one should be used is based on how many sinks each net in the level drives, the size and placement of each FO structure and appropriate source to sink connectivity. The initial size is chosen as ⅔ of the distance the furthest sink form the source. The initial size will change depending on the load impact on the net diver as indicated by SPICE simulations of each net within the network.

To tune the clock skew across every sink within all nets of a level, the process uses a combination of stub movements and SPICE simulations to determine if the design objectives have been met. The SPICE simulations are performed from the root of the tree (connected to a PLL) up to the level being designed. Tuning automation is possible by knowing in advance what the minimum delay change is for the smallest stub movement. The difference in delay between two sinks divided by the minimum change gives how much a stub should move.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 2:
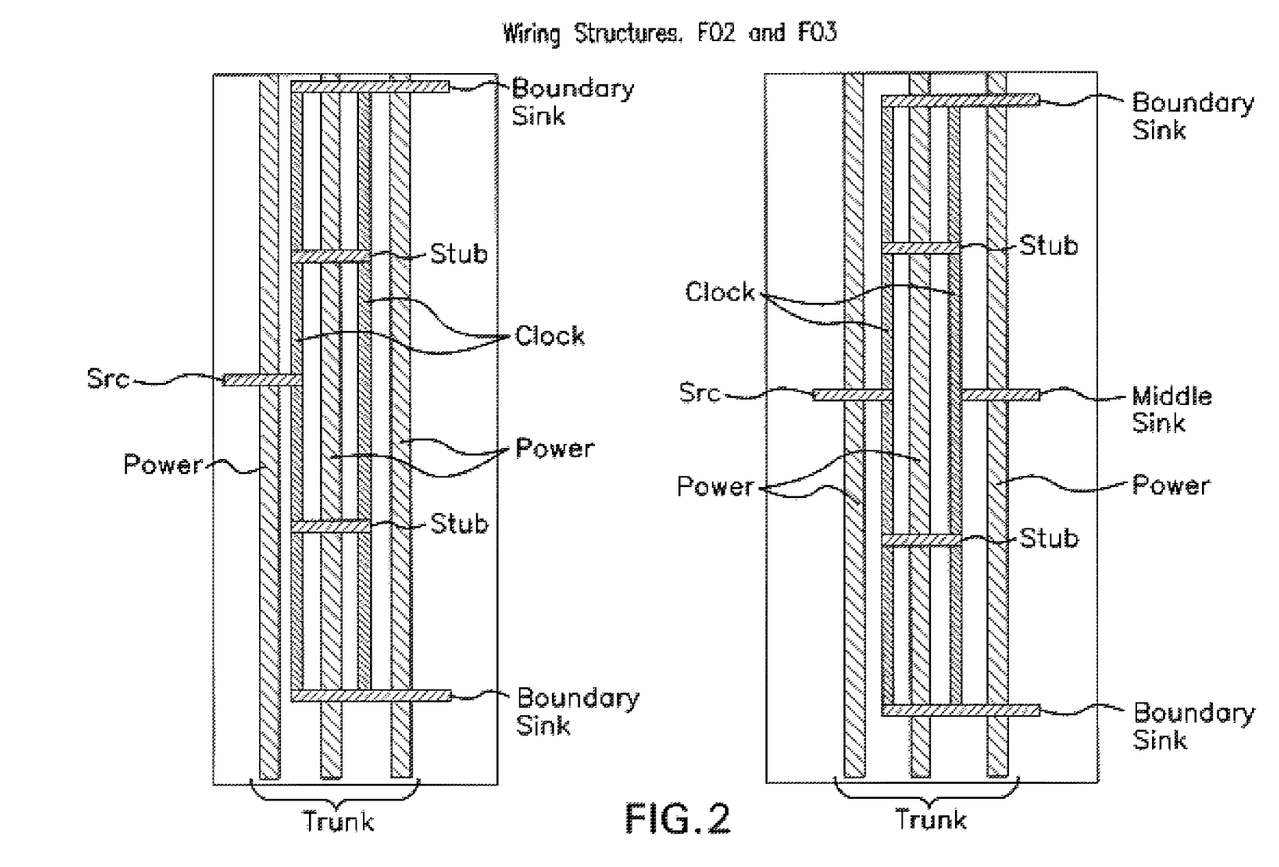
FIG. 2 is a representational view of two wiring structures in accordance with the teachings of this invention, the structure on the left hand side of FIG. 2 representing the FO2 structure shown diagrammatically in FIG. 3 and the right hand structure representing the FO3 structure shown in FIG. 3.
Figure 3:
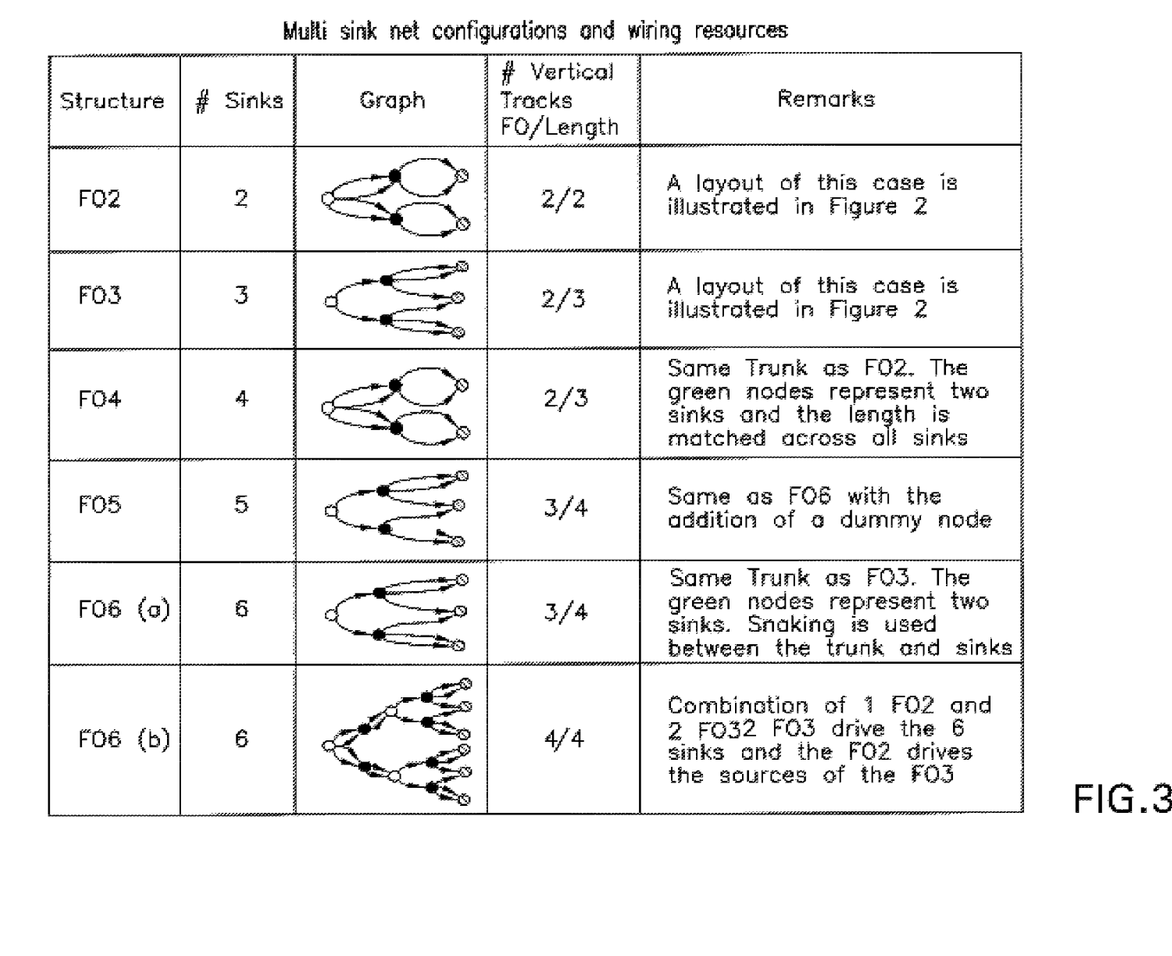
FIG. 3 is a table showing some the FO structure diagrams in according with the teachings of this invention for various multi-sink net configurations.

Referring now to FIGS. 2 and 3, the core of the wiring structure, FO structure, is a trunk comprised of two or more parallel clock signal wires occupying adjacent bays between power wires. The bays span the distance among all the sinks to be served by the clock signal source. The clock signal wires are connected one to another at each terminus and are shorted with stubs at strategic intermediate locations selected for tuning purposes. Because the length of clock wiring trunks is much higher than the length of the stubs, these stubs are insignificant in terms of overall delay. Two examples of this structure are illustrated in FIG. 2 for a source driving two and three sinks respectively. With reference to FIG. 1, the source in FIG. 2 corresponds to the PLL clock source and the sinks correspond to the sector buffers in a stage of a tree.

The basic strategy behind a FO wiring structure is to design it such that there are the same wiring resources from source to each sink of the tree. The differences are determined by the placement constraints of sector buffers and wiring constraints dictated by the power and I/O resources. FIG. 3 illustrates the wiring configurations for nets with different number of sinks. The open node represents the source, the hatched nodes are the sinks and the black nodes are the movable stubs for delay tuning.

The power distribution is an overlap of vertical and horizontal wires parallel to each other creating multiple grids. The vertical wires are on a different metal plane then the horizontal wires to avoid shorts. The spacing between two parallel wires is pre-defined and designed to allow other wires to go in between. This pre-defined spacing between parallel power wires is known as the power grid pitch. The actual value depends on several things like technology, chip size, power requirements, wiring resources, etc. As an example, if two power wires, 3 µm thick, are separated by 5.6 µm the power grid pitch is 8.6 µm.

As referred previously, a single clock wire goes inside a power bay. For the power grid example before the maximum width of the clock wire is less then 5.6 µm. Due to DRC (Design Rule Checking) spacing rules there must be a minimum spacing between the clock wire and the power wire. For this example, the spacing is 1.3 μm which means that the width of the clock wire is 3 μm.

The graph representation for each structure is depicted to illustrate that the same wiring resources connect the source to each and every sink. This is a requirement to enable delay balancing and guarantee that signal slew closely matches at every sink of the structure. The fourth column gives the actual number of wiring tracks used by each configuration. The second number in column four is the number of tracks required to connect source to sinks if a length matching technique was used instead of an FO structure. As the number of sinks increase, FO structure requires less wiring resources, a rare commodity in high performance chips.

The stubs affect timing because by moving them the amount of wire from source to sink changes. Consider for example the graph of the FO3. If the top stub is moved closer to the top sink, it makes this sink faster then the other two sinks, because the effective resistance from source to the top sink is reduced while it increases for the middle sink and stays the same for the bottom sink. The stubs and snakes move by increments due to the design of the wire structures. As discussed before the clock wires are designed to take up all the space between power wires. See the example. As such the adjustment of delay on a clock structure can only happen when the wires jump from power bay to power bay. For the previous example of power grid structure and clock wire width the minimum move of a clock wire (stub or otherwise) is an increment of 8.6 μm.

The first implementation for an FO6 [FO6 a)] only uses a single trunk. However, two sinks are driven by each Boundary Sink connection of the trunk. This requires one or two tracks depending if snaking is necessary to reach each sink. If snaking is not required, an alternative solution would be the FO6 variation [FO6 (b)]The drawback is that this variation requires one more vertical track then variation FO6 (6). Therefore, the combination of FO structures to drive nets with larger number of sinks needs to be chosen in light of the wiring track resources available. As the number of sinks increase the layout structures are formed by combining the simple structures in FIG. 3 onto the desired configuration.

As the number of sinks increase, the layout structures are formed by combining the simple structures in FIG. 3 to the desired configuration. For example, to drive 9 sinks one can use 4 FO3 structures and still use at most 4 tracks. The 9 sinks are driven by 3 FO3, and these 3 are driven by another FO3. The first implementation for an FO6 [FO6 (a)] only uses a single trunk. However, two sinks are driven by each Boundary Sink connection of the trunk. This requires one or two tracks depending if snaking is necessary to reach each sink. This implementation may be preferable to the second one [(FO6 (b)] with three trunks if the three sinks are close to each other.

These structures may not be suitable for driving nets with randomly placed sinks in small areas, for example a sector grid area. This is because the structure does not provide the flexibility for individual tuning required by each sink particularly if each sink has a different capacitance load. However, from the buffer sector grids to the PLL it is possible to define sink locations such that the overall topology conforms to an FO structure as described in FIG. 3. Furthermore, there is still the potential of using the FO structures with nets with randomly placed sinks if a cluster algorithm is used to identify sink clusters with similar load where the placement of each cluster falls into a pattern of vertical or horizontal alignment.

Figure 4:
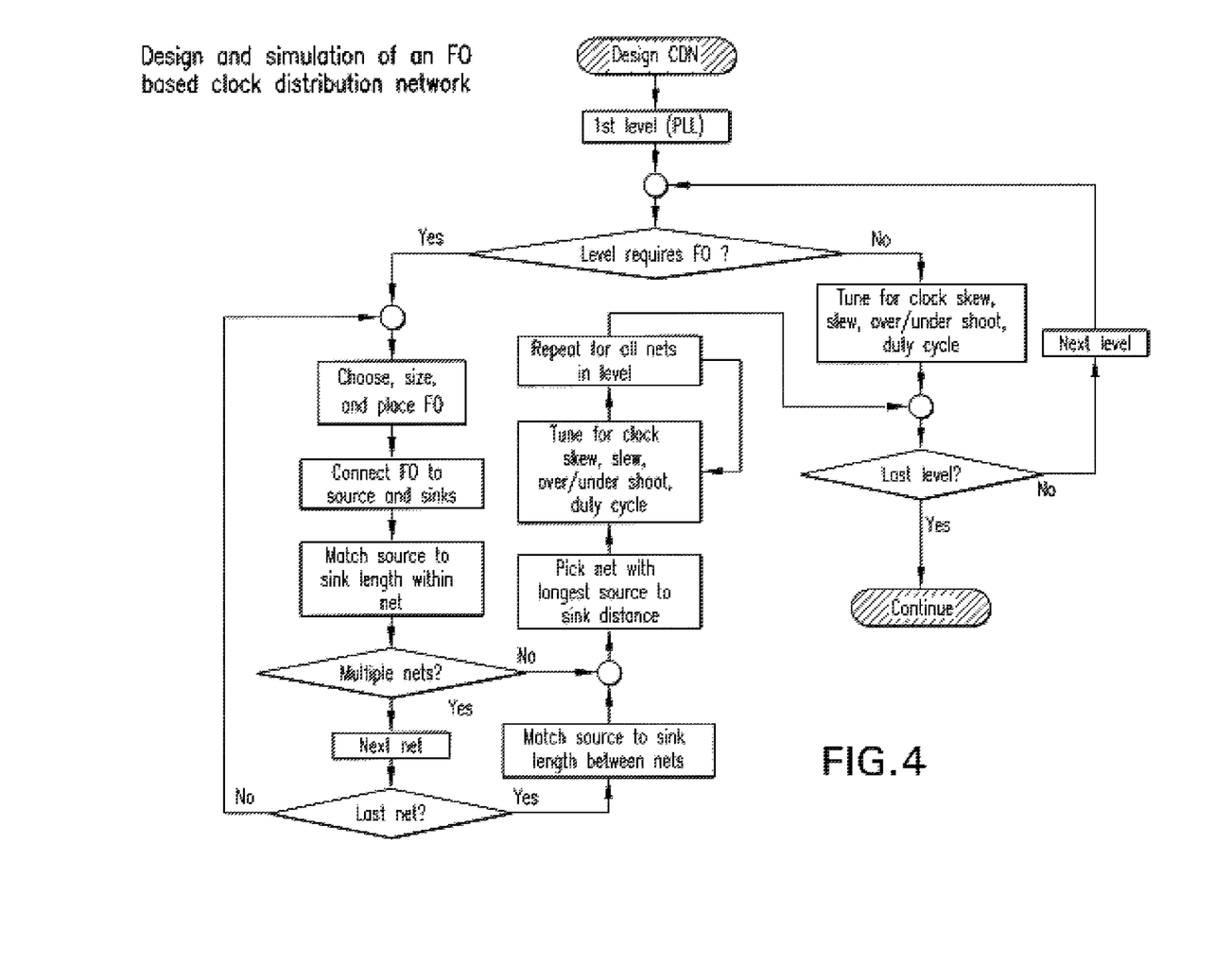
FIG. 4 is a flow chart of a design and simulation of an FO based clock distribution network in accordance with the teachings of the invention.

Referring now to FIG. 4, in GHz chip design, delay and waveform slew are two critical design parameters that are carefully controlled in order to achieve the desired very low clock skews at the inputs of Clock Sector Buffers. In the design example the clock skew must be less then 2 ps across all 240 buffers on the chip. To reach such accuracy in simulation, the delay at each level of the tree must be the same. Equally important, the waveform slew at the input of the sinks at each level must also be very similar. This guarantees that the drive of the next buffer stage to be under very similar conditions. If the slews at the input of two buffers driving nets of the next stage are not similar (within 10 ps of each other for the chip example) it is very difficult to match the delay and slews of the next stage, therefore preventing meeting the design objectives. The FO structures address this requirement. Along with these structures, a design methodology in accordance with the invention defines each net structure within a clock tree level such that the delay, clock skew and clock slew requirements are met. This methodology chooses which FO structure is used and how much wire snaking is necessary to meet the same length requirement between the source and sinks as needed for clock slew.

Furthermore, the accuracy of simulation is only possible if very accurate device models are used for the buffers and accurate RLC models are used for the wiring structures. This brings up the aspect of RLC extraction, which depends on the geometry of the designed layouts. The FO structures facilitate this extraction since they are built with fixed width wires placed in between power wires used as shields. This facilitates parasitic extraction (LC) as compared to a similar structure where wire width was used as a tuning mechanism.

Using the structures in FIG. 3 and the number of sinks per net within a level, an FO structure is chosen. The initial height or length of an FO structure depends on the largest separation between sinks and if the sinks are arranged in the vertical or horizontal. For example, assume that the sink orientation is vertical. If a single FO structure is used (nets<=6 sinks) the initial height is chosen to be ⅔ of the distance between the furthest sinks. For the chip design example the trunk of an FO6 could be more then 4 mm high. As this may add too much delay to the stage the size will be re-defined after initial delay simulations. The FO is then placed in the design closest to the buffer driving the net source. Furthermore, it is important for the source to drive approximately at the halfway point of the FO structure. Also, the FO placement is such that it lines up with power grid and avoids any I/O wiring reservations. Afterwards, the FO is connected to the sinks with a straight connection or through snake wires. The addition of snaking depends on factors set forth in paragraph [0040]. As the number of sinks increase the layout structures are formed by combining the simple structures in FIG. 3 to the desired configuration. For example, to drive 9 sinks one can use 4 FO3 structures and still use at most 4 tracks. The 9 sinks are driven by 3 FO3, and these 3 are driven by another FO3. The first implementation for an FO6 [FO6 (a)] only uses a single trunk. However, two sinks are driven by each Boundary Sink connection of the trunk. This requires one or two tracks depending if snaking is necessary to reach each sink. This implementation may be preferable to the second one [FO6 (b)] with three trunks if the sinks are close to each other.

These structures are not recommended for driving nets with randomly placed sinks in small areas, for example a sector grid area. This is because the structure does not provide the flexibility for individual tuning required by each sink particularly if each sink has a different capacitance load. However, from the buffer sector grids to the PLL it is possible to define sink locations such that the overall topology conforms to an FO structure as described in FIG. 3. Furthermore, there is still the potential of using the FO structures with nets with randomly placed sinks if a cluster algorithm is used to identify sink clusters with similar load where the placement of each cluster falls into a pattern of vertical or horizontal alignment.

In Hz chip design, delay and waveform slew are two critical design parameters that are carefully controlled in order to achieve the desired very low clock skews at the inputs of Clock Sector Buffers. In the design example the clock skew must be less then 2 ps across all 240 buffers on the chip. To reach such accuracy in simulation, the delay at each level of the tree must be the same. Equally important, the waveform slew at the input of the sinks at each level must also be very similar. This guarantees that the drive of the next buffer stage to be under very similar conditions. If the slews at the input of two buffers driving nets of the next stage are not similar (within 10 ps of each other for the chip example) it was very difficult to match the delay and slews of the next stage, therefore preventing meeting the design objectives. The FO structures were designed to address this requirement. Along with it a design methodology was created to define each net structure within a clock tree level such that the delay, clock skew and clock slew requirements were met. This methodology chooses which FO structure is used and how much wire snaking is necessary to meet the same length requirement between the source and sinks as needed for clock slew.

Furthermore, the accuracy of simulation is only possible if very accurate device models are used for the buffers and accurate RLC models are used for the wiring structures. This brings up the aspect of RLC extraction, which depends on the geometry of the designed layouts. The FO structures facilitate this work since they are built with fixed width wires placed in between power wires used as shields. This facilitates parasitic extraction (LC) as compared to a similar structure where wire width was used as a tuning mechanism.

Using the structures in FIG. 3 and the number of sinks per net within a level, a FO structure is chosen. The initial height or length of an FO structure depends on the largest separation between sinks and if the sinks are arranged in the vertical or horizontal. Assume that the sink orientation is vertical. If a single FO structure is used (nets<=6 sinks) the initial height is chosen to be $2/3$ of the distance between the furthest sinks. For the chip design example the trunk of an FO6 could be more then 4 mm high. As this may add too much delay to the stage the size will be re-defined after initial delay simulations. The FO is then placed in the design closest to the buffer driving the net source. Furthermore, it is important for the source to drive approximately at the halfway point of the FO structure. Also, the FO placement is such that it lines up with power grid and avoids any I/O wiring reservations. Afterwards, the FO is connected to the sinks with a straight connection or through snake wires. The addition of snaking depends on If the distance between source and each sink within a net is not the same, snaking is added to sinks closer to the source.

The number sinks driven per net. For a given level the load per net must be the same therefore dummy loads are added to the nets with less sinks.

If there are multiple nets within a level the source to sink distance must be the same between all nets Snaking can also be added to facilitate delay and clock skew tuning within a net and across nets of the same level.

The methodology for designing FO based levels with a clock distribution network is illustrated in FIG. 4. The process starts with the first net connected to the PLL. If no FO structures can be used for a level, wires are designed and tuned to meet design constraints. In the design example, there are seven buffer levels. The first two required specialized wires, while the next five required FO structures.

The use of FO structures is indicated if the sinks (or small clusters of sinks) of a net line-up in the horizontal or vertical and the distance between the furthest sinks (or clusters) is larger then the size of a Clock Sector (1×1 or 1.5×1.5 mm in the design example). The number of sinks in the net and their relative location to the source is used to choose which FO structure to use. The initial size is $2/3$ of the distance between the furthest sinks. The placement is such that it is closest to the source driver and such that the driver is at the middle point of the FO height. The sinks of the net are connected to the Boundary sinks of the FO structure making sure that the wire length is always the same. This process is repeated for all levels in the net. Afterwards, the length between sink and Boundary sink of FO is evaluated across all sinks of all nets. The initial wires within a net can be increased if the length in another net is higher.

Tuning the FO structures is performed to meet the clock skew and slew constraints. The objective is for all nets to have the same delay within and intra nets. Furthermore, the clock slew must be also within the design margins (<10 ps). The simulations are always carried out starting from the PLL port to ensure that the waveform slew effects from previous stages are taken into consideration. The design and tuning process continues until all levels have been processed.

Figure 5:
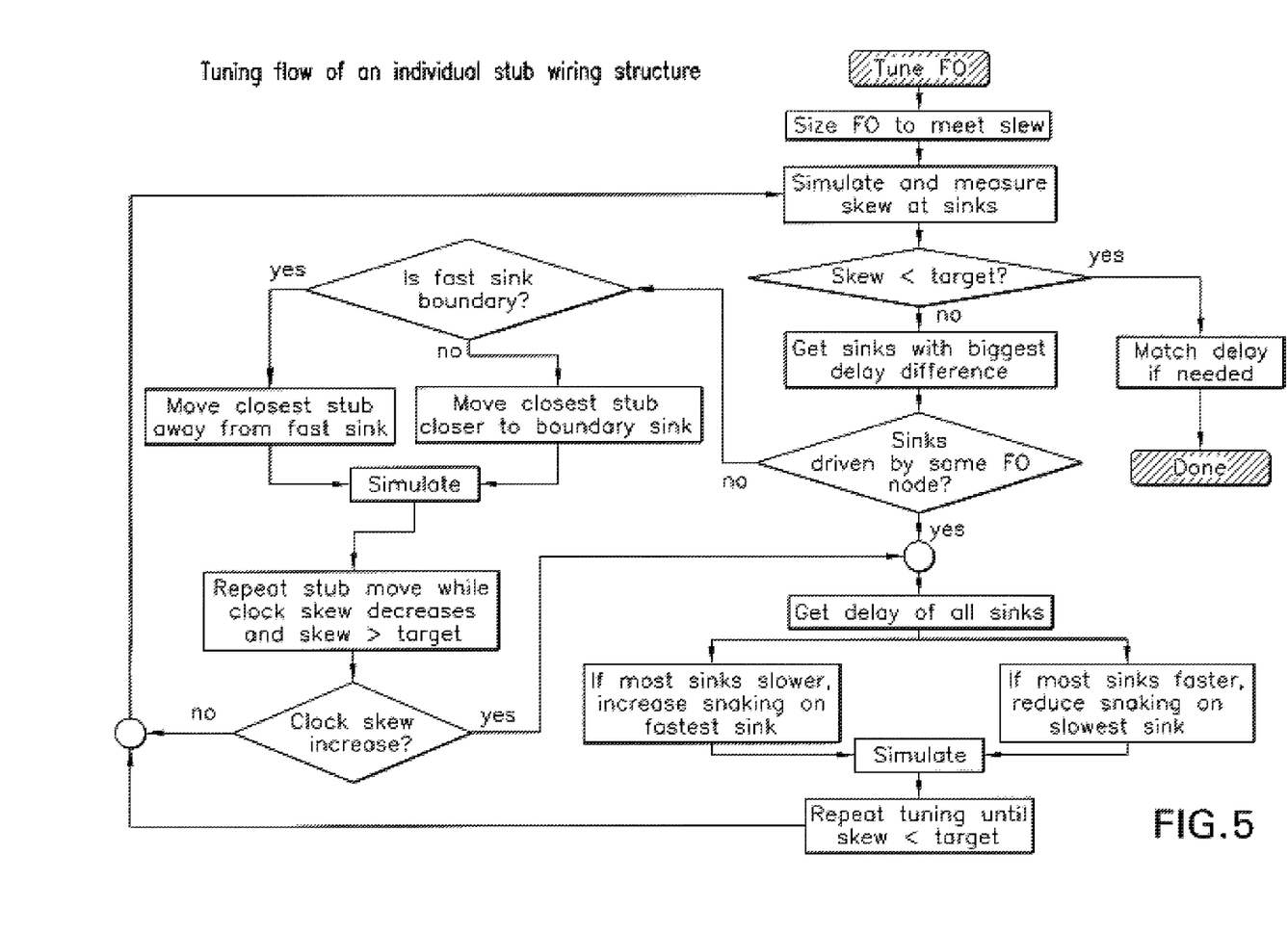
FIG. 5 is a flow chart showing the process in tuning an individual stub wiring structure.

Once all nets within a level have the wires connected, they are tuned by moving stubs and/or changing snake length. Both techniques are discrete in nature because of the power grid. A stub can only move by increments of the power grid pitch. Likewise, increase or decrease of snaking is also in increments of one or more power bay grids. From SPICE simulation of one power bay change, the minimum rate of change of delay is determined for each technique. This information is used by the methodology to determine the tuning applied to each FO structure to match delay between the source and the sinks. A flow chart of the net tuning process is shown in FIG. 5.

The tuning work for a net works in stages. The first step is to determine if the size of the FO structure is appropriate. As previously mentioned the initial size of an FO structure is $2/3$ of the total length between the furthest sinks. The first simulation will tell if the waveform slew at the input sinks is less then the specified slew limit. If the slews are higher, the FO structure is shortened until the slews get within the limits. The shortening is also in decrements of power grid bays. The process of move and simulation is repeated until the slews get within the limits.

The next step is to move the stubs to attempt to match the delay on all the sinks. The movement is as follows. This process occurs in stages working with two sinks at a time. From simulation the two sinks that give the worst clock skew are selected. If they are driven by the same node of the FO structure the fix is to change snake length. The wire to be changed is the one connected to the sink with greatest deviation. The change is in increments of the power grid pitch. From simulation the amount of delay change by moving a wire by a power grid pitch is known. Dividing the delay difference between sinks by the delay change gives the number of power grid steps the algorithm must perform to equalize the delay between sinks. The layout structure is changed and re-simulated to validate the fix. If the new wire structure overlaps with existing wiring resources (I/O wires for example) a search is performed in the adjacent area to implement the desired length.

If the two sinks are driven by different FO nodes the first step of tuning is by moving the stubs. Each stub is moved at a time. Once again the sink with greatest deviation determines which stub to move. If the sink is faster, the closest stub moves away from it slowing the sink down. If the sink is slower, the closest stub moves closer to it to speed up the sink. Through simulation and repetitive move of stubs the clock skew is fixed. The clock skew may not be fixed due to wire constraints in moving the stubs between power grid bays or because the difference cannot be fixed with movement alone. If such scenario occurs snaking is also used to fix the clock skew problem. The snake tuning procedure is the same explained previously. In the design example, for FO structures with similar source to sink length it was possible to tune the clock skew with this approach by fractions of ps. Once the clock skew between the two sinks is fixed the net is re-simulated and a new pair is chosen to be tuned. This process is repeated until the clock skew for the net is within limits.

Often a level on the tree may have multiple nets. Therefore, the clock skew must be satisfied not only within the sinks of a tree but across the sinks of all nets. The methodology to accomplish this simulates the tree from the PLL to the level being tuned including all the nets in the level. The net with the longest delay is chosen to be tuned. The tuning procedure described is applied to the net. After tuning, the network is simulated again. The net with longest delay is picked. If it is the net just tuned, the net delay becomes a target for all the other nets. Each net is first timed to meet the clock skew constraint. After that, snaking is added to the appropriate sinks to match the delay of the slowest net. This process is repeated for all nets in the level.

Note that the length matching done during the construction phase of the clock distribution network should have given similar wiring structures. Furthermore, the buffers driving each level of the tree were chosen to be the same. These measures reduce delay variations across the levels. As a consequence, the tuning flow does not dramatically change the wiring structure of each net.

The combination of tuning within a net and across nets was used in the design example running at nominal 1.5 GHz. The last stage driving the Clock Sector Buffers is composed of 45 nets driving a total of 240 sinks and after tuning the nominal clock skew was 1.1 ps while the worst clock skew across all corner and voltage simulations was 2.6 ps.

The capabilities of the present invention can be implemented in a software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A clock signal distribution system for distributing high frequency clock signals to a plurality of physically separate sinks on a semiconductor chip, comprising in combination:
    a pair of clock signal tracks extending along parallel paths and joined together at each end;
    a clock signal source coupled to said clock signal tracks at a point intermediate said each end;
    one clock signal track coupling said clock signal tracks to one of said physically separated sinks;
    another clock signal track coupling said clock signal tracks to another of said physically separated sinks; and
    a tuning stub connected across said pair of clock signal tracks located at a point between said source and said one of said physically separated sinks selected to reduce clock timing skew between said one of said physically separated sinks and said another of said physically separated sinks.

2. A clock signal distribution system as in claim 1 further including a tuning stub connected across said pair of clock signal tracks located at a point between said source and said another of said physically separated sinks selected to reduce clock timing skew between said one of said physically separated sinks and said another of said physically separated sinks.

3. A clock signal distribution system as in claim 1 wherein said semiconductor chip includes parallel power conducting tracks extending to said plurality of physically separated sinks, and said pair of clock signal tracks is disposed adjacent said power conducting tracks.

4. A clock signal distribution system as in claim 2 wherein said semiconductor chip includes parallel power conducting tracks extending to said plurality of physically separated sinks, and said pair of clock signal tracks is disposed adjacent said power conducting tracks.

5. A clock signal distribution system as in claim 1 wherein said point between said source and said one of said physically separated sinks is determined by an iterative simulation process.

6. A clock signal distribution system as in claim 2 wherein said point between said source and said another of said physically separated sinks is determined by an iterative simulation process.

7. A clock signal distribution system as in claim 4 wherein said point between said source and said one of said physically separated sinks is determined by an iterative simulation process.

8. A clock signal distribution system as in claim 3 wherein said point between said source and said one of said physically separated sinks is determined by an iterative simulation process.

9. A clock signal distribution system as in claim 4 wherein said point between said source and said one of said physically separated sinks is determined by an iterative simulation process.

10. A clock signal distribution system as in claim 5 wherein said point between said source and said another of said physically separated sinks is determined by an iterative simulation process.

11. A clock signal distribution system as in claim 5 wherein said iterative simulation process moves said stub in increments equal to the power grid pitch.

12. A clock signal distribution system as in claim 6 wherein said iterative simulation process moves said stub in increments equal to the power grid pitch.

13. A clock signal distribution system as in claim 7 wherein said iterative simulation process moves said stub in increments equal to the power grid pitch.

14. A method for designing a clock signal distribution system from a global clock source to a plurality of physically separated sinks, including the steps of:
   selecting a wiring structure, said wiring structure having one or more tuning stubs, each of which is connected across a pair of clock signal tracks at a point between said source and one of said physically separated sinks;
   simulating, by using a computer, the selected wiring structure to determine waveform slew at said plurality of physically separated sinks;
   changing the selected wiring structure to bring the waveform slew within specified limits; and
   moving at least one of said one or more stubs of the wiring structure to match the delay on all sinks.

15. A method for designing a clock distribution system as in claim 14 wherein said moving step includes working with two sinks at a time starting with simulating two sinks that give the maximum clock skew.

16. A method for designing a clock distribution system as in claim 14 wherein in said moving step simulation said stubs are moved in predetermined increments.

17. A method for designing a clock distribution system as in claim 15 wherein in said moving step simulation said stubs are moved in predetermined increments.

18. A method for designing a clock distribution system as in claim 16 wherein one predetermined increment is equal to the power grid pitch.

19. A method for designing a clock distribution system as in claim 17 wherein one predetermined increment is equal to the power grid pitch.

* * * * *